United States Patent
Na et al.

(10) Patent No.: US 7,821,003 B2
(45) Date of Patent: Oct. 26, 2010

(54) THIN-FILM TRANSISTOR SUBSTRATE AND DISPLAY DEVICE HAVING THE SAME

(75) Inventors: Hye-Seok Na, Seoul (KR); Won-Hee Lee, Seoul (KR); Ho-Kyoon Kwon, Seoul (KR); Byoung-Sun Na, Hwaseong-si (KR); Soon-Il Ahn, Cheonan-si (KR); Ji-Hyun Kwon, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/393,970

(22) Filed: Feb. 26, 2009

(65) Prior Publication Data
US 2009/0230396 A1 Sep. 17, 2009

(30) Foreign Application Priority Data
Mar. 17, 2008 (KR) .................. 10-2008-0024441

(51) Int. Cl.
H01L 29/04 (2006.01)
(52) U.S. Cl. .................. 257/59; 257/57; 257/72
(58) Field of Classification Search .......... 257/57, 257/59, 72
See application file for complete search history.

(56) References Cited
U.S. PATENT DOCUMENTS
2009/0102773 A1* 4/2009 Um et al. ............ 345/92

* cited by examiner

Primary Examiner—Long Pham
(74) Attorney, Agent, or Firm—Innovation Counsel LLP

(57) ABSTRACT

Provided are a thin-film transistor (TFT) substrate and a display device having the same. In the TFT substrate and the display device having the same, first and second drain electrodes of first and second TFTs connected to first and second pixel electrodes, respectively, are vertically bent a plurality of times. The distance between each of the first and second source electrodes and the first or second drain electrode is maintained at a minimum interline gap to increase the distance between a data line and each of the first and second drain electrodes and minimize the length of a region of each of the first and second drain electrodes adjacent to the data line. Consequently, a coupling capacitance between the data line and each of the first and second drain electrodes can be reduced, and each unit pixel region can have a uniform parasite capacitance within a predetermined range. In addition, the luminance deviation of a display device, which performs inversion driving, can be reduced.

21 Claims, 9 Drawing Sheets

THIN-FILM TRANSISTOR SUBSTRATE AND DISPLAY DEVICE HAVING THE SAME

This application claims priority under 35 U.S.C. §119 to Korean Patent Application No. 10-2008-0024441 filed on Mar. 17, 2008 in the Korean Intellectual Property Office, the disclosure of which is incorporated herein by reference in its entirety.

BACKGROUND OF THE INVENTION

1. Field of the Invention

The present invention relates to a thin-film transistor (TFT) substrate and a display device having the same, and more particularly, to a TFT substrate and a display device having the same, in which the difference between luminances of adjacent pixels can be reduced during inversion driving of the display device.

2. Description of the Related Art

Liquid crystal displays (LCDs) are one of the most widely used flat panel displays (FPDs) and use optical anisotropy and polarization properties of liquid crystals to produce images. That is, an LCD displays a desired image by adjusting the alignment of liquid crystals control the transmittance of light emitted from a backlight unit to a liquid crystal display panel. In order to enhance the image quality of the liquid crystal panel (for example, remove a ghost effect), the LCD is driven at 60 Hz or higher. In addition, the LCD has performed 'inversion driving' in which polarities of adjacent unit pixels are opposite to each other in order to prevent the creation of stains (for example, vertical lines or horizontal lines) on the liquid crystal display panel.

Recently, the size of each unit pixel has gradually been reduced to manufacture a high-resolution display panel. However, a smaller unit pixel has resulted in the deterioration of luminance difference characteristics during inversion driving. That is, the difference between luminances of adjacent unit pixels has increased due to inversion driving.

SUMMARY OF THE INVENTION

Aspects of the present invention provide a thin-film transistor (TFT) substrate and a display device having the same, in which a parasite capacitance between a device in each pixel and a data line adjacent to the device is reduced to reduce the luminances difference between of adjacent pixels.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a TFT substrate including: a plurality of gate lines and a plurality of first and second data lines which cross the gate lines; a plurality of first and second pixel electrodes disposed in a plurality of unit pixel regions defined by the gate lines and the first and second data lines, respectively; a first TFT disposed in a unit pixel region and includes a first gate terminal connected to a gate line, a first source electrode connected to a first data line, and a first drain electrode connected to any one of first and second pixel electrodes; and a second TFT disposed in the unit pixel region and includes a second gate terminal connected to the gate line, a second source electrode connected to a second data line, and a second drain electrode connected to the other one of the first and second pixel electrodes, wherein the first and second drain electrodes are disposed to maintain the difference between a first coupling capacitance between the first drain electrode and the first data line and a second coupling capacitance between the second drain electrode and the second data line within a range of 50% or less of a maximum of the first and second coupling capacitances.

The difference between the first coupling capacitance and the second coupling capacitance may be 5 to 40% of a maximum of the first and second coupling capacitances. The first and second drain electrodes may be vertically bent.

End regions of the first and second drain electrodes may be separated from the first and second source electrodes, respectively, and a distance between the end region of each of the first and second drain electrodes and the first or second source electrode may be equal to a distance between a region extending from an end of the end region of each of the first and second drain electrodes, at which the first or second drain electrode is bent, and the first or second source electrode.

Respective regions of the bent first and second drain electrodes may be separated from each other by the above distance in the center of the unit pixel region.

The distance may be an interline gap which is sufficient to prevent a short circuit between each of the first and second source electrodes and the first or second drain electrode, and the interline gap may be 4 to 10 μm.

The first drain electrode may include a first electrode portion disposed above the first gate electrode and adjacent to the first source electrode, a first contact plate connected to one of the first and second pixel electrodes, and a first connection line that connects the first electrode portion to the first contact plate, and the second drain electrode may include a second electrode portion disposed above the second gate electrode and adjacent to the second source electrode, a second contact plate connected to the other one of the first and second pixel electrodes, and a second connection line that connects the second electrode portion to the second contact plate.

The first contact plate of the first drain electrode in a first unit pixel region may be connected to the first pixel electrode, and the second contact plate of the second drain electrode in the first unit pixel region may be connected to the second pixel electrode, while the first contact plate of the first drain electrode in a second unit pixel region adjacent to the first unit pixel region is connected to the second pixel electrode, and the second contact plate of the second drain electrode in the second unit pixel region is connected to the first pixel electrode.

If the first contact plate of the first drain is connected to the first pixel electrode and the second contact plate of the second drain electrode is connected to the second pixel electrode, the first connection line may include a 1-1 extension portion extending from the first electrode portion in a direction away from the first gate electrode, a 1-2 extension portion extending from an end of the 1-1 extension portion to be bent in a direction opposite to that of the first data line, a 1-3 extension portion extending from an end of the 1-2 extension portion to be bent in a direction toward the first contact plate, a 1-4 extension portion extending from an end of the 1-3 extension portion to be bent in the direction opposite to that of the first data line, and a 1-5 extension portion connecting the 1-4 extension portion to the first contact plate, and the second connection line may include a 2-1 extension portion extending from the second electrode portion in a direction away from the second gate electrode, a 2-2 extension portion extending from an end of the 2-1 extension portion to be bent in a direction opposite to that of the second data line, and a 2-3 extension portion connecting the 2-2 extension portion to the second contact plate.

A distance between the 1-3 extension portion and the first data line and a distance between the 1-5 extension portion and the first data line may be greater than a distance between the 1-1 extension portion and the first data line, and the distance between the 1-1 extension portion and the first data line may be equal to a distance between the 2-1 extension portion and the second data line within an acceptable error range.

If the first contact plate of the first drain is connected to the second pixel electrode and the second contact plate of the second drain electrode is connected to the first pixel electrode, the first connection line may include a 1-6 extension portion extending from the first electrode portion in the direction away from the first gate electrode, a 1-7 extension portion extending from an end of the 1-6 extension portion to be bent in the direction opposite to that of the first data line, and a 1-8 extension portion connecting the 1-7 extension portion to the first contact plate, and the second connection line may include a 2-4 extension portion extending from the second electrode portion in the direction away from the second gate electrode, a 2-5 extension portion extending from an end of the 2-4 extension portion to be bent in the direction opposite to that of the second data line, a 2-6 extension portion extending from an end of the 2-5 extension portion to be bent in a direction toward the second contact plate, a 2-7 extension portion extending from an end of the 2-6 extension portion to be bent in the direction opposite to that of the second data line, and a 2-8 extension portion connecting the 2-7 extension portion to the second contact plate.

A distance between the 2-6 extension portion and the second data line and a distance between the 2-8 extension portion and the second data line may be greater than a distance between the 2-4 extension portion and the second data line, and the distance between the 2-4 extension portion and the second data line may be equal to a distance between the 1-6 extension portion and the first data line within an acceptable error range.

The first and second data lines, the first and second source electrodes, and the first and second drain electrodes may be made of an identical material and simultaneously patterned.

The substrate may further include: a plurality of storage lines that pass through the unit pixel regions, respectively, and extend in a direction identical to that of the gate lines; and first and second coupling protrusions that extend from each of the storage lines and partially overlap the first and second pixel electrodes, wherein the first coupling protrusion is disposed adjacent to the first data line, the second coupling protrusion is disposed adjacent to the second data line, and the first coupling protrusion is longer than the second coupling protrusion.

According to another aspect of the present invention, there is provided a display device including: a plurality of unit pixels each arranged in a matrix and includes a first pixel capacitor having a first pixel electrode and a common electrode and a second pixel capacitor having a second pixel electrode and the common electrode; a plurality of gate lines that extend in a row direction of the unit pixels; a plurality of first and second data lines that extend in a column direction of the unit pixels and are arranged on both sides of each column of unit pixels, respectively; a first TFT disposed in each of the unit pixels and comprises a first source electrode connected to the first data line and a first drain electrode connected to any one of the first and second pixel capacitors; and a second TFT disposed in each of the unit pixel regions and comprises a second source electrode connected to the second data line and a second drain electrode connected to the other one of the first and second pixel capacitors, wherein the first and second drain electrodes are bent a plurality of times to maintain the difference between a first coupling capacitance between the first drain electrode and the first data line and a second coupling capacitance between the second drain electrode and the second data line within a range of 50% or less of a maximum of the first and second coupling capacitances.

The first and second drain electrodes may be vertically bent.

End regions of the first and second drain electrodes may be separated from the first and second source electrodes, respectively, and a distance between the end region of each of the first and second drain electrodes and the first or second source electrode may be equal to a distance between a region extending from an end of the end region of each of the first and second drain electrodes, at which the first or second drain electrode is bent, and the first or second source electrode.

The distance may be an interline gap which is sufficient to prevent a short circuit between each of the first and second source electrodes and the first or second drain electrode, and the interline gap may be 4 to 10 μm.

The first drain electrode may include a first electrode portion disposed above a first gate electrode and adjacent to the first source electrode, a first contact plate connected to one of the first and second pixel electrodes, and a first connection line that connects the first electrode portion to the first contact plate, and the second drain electrode may include a second electrode portion disposed above the second gate electrode and adjacent to the second source electrode, a second contact plate connected to the other one of the first and second pixel electrodes, and a second connection line that connects the second electrode portion to the second contact plate.

The first contact plate of the first drain electrode in a first unit pixel may be connected to the first pixel capacitor, and the second contact plate of the second drain electrode may be connected to the second pixel capacitor, while the first contact plate of the first drain electrode in a second unit pixel adjacent to the first unit pixel is connected to the second pixel capacitor, and the second contact plate of the second drain electrode is connected to the first pixel capacitor.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
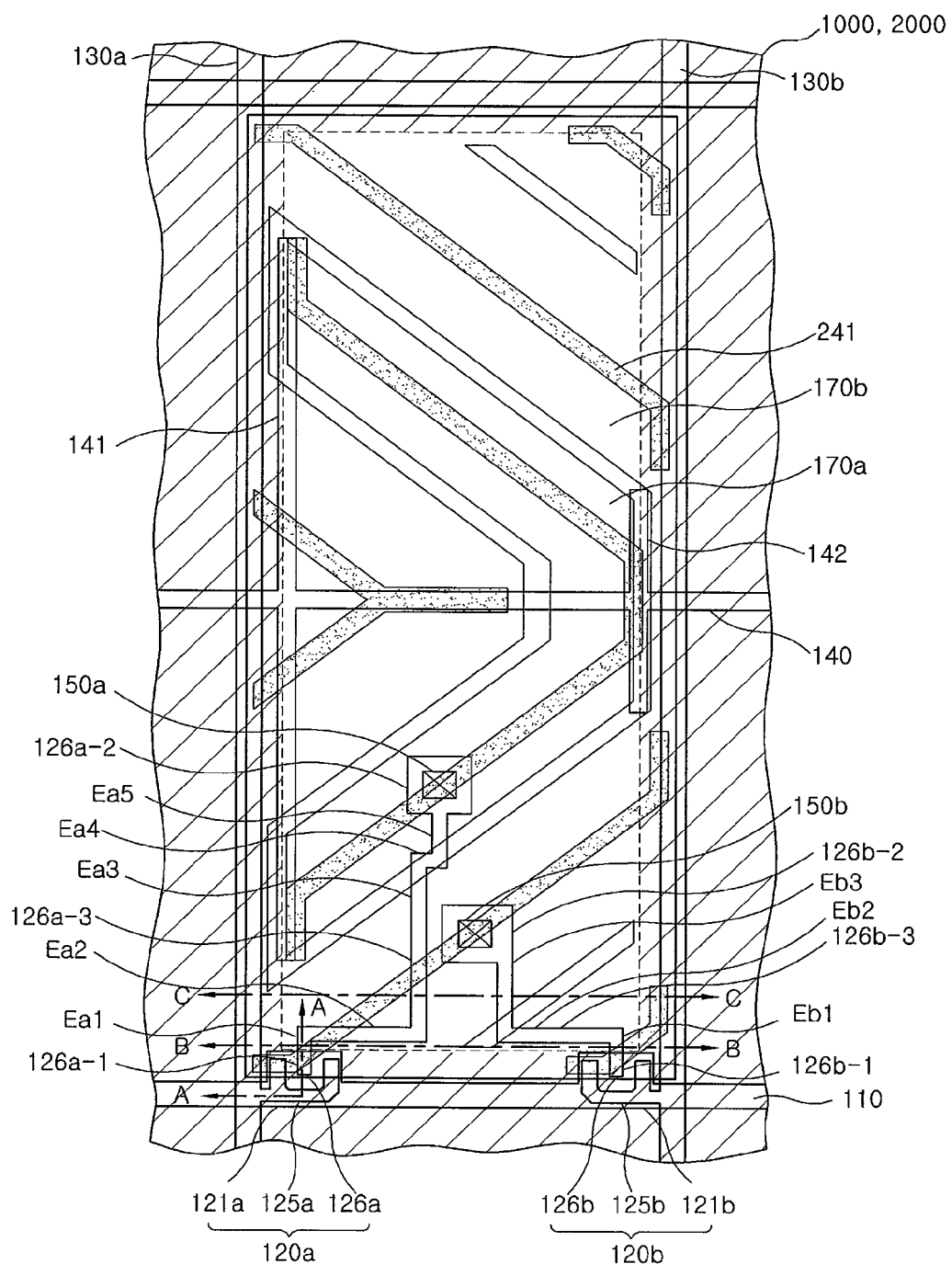
FIG. 1 is a plan view of a display device according to an exemplary embodiment of the present invention.

Features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

Spatially relative terms, such as "below," "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like reference numerals refer to like elements throughout the specification.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

Figure 2:
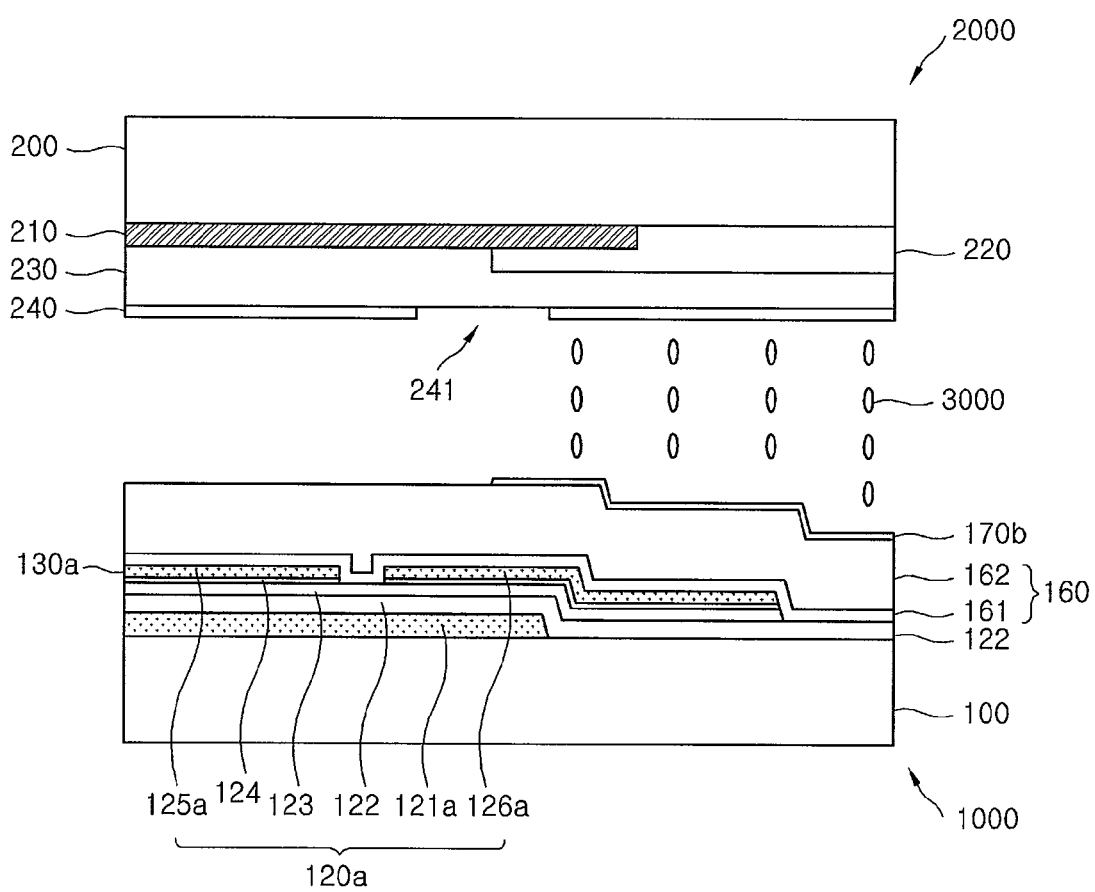
FIG. 2 is a cross-sectional view of the display device taken along a line A-A of FIG. 1.
Figure 3:
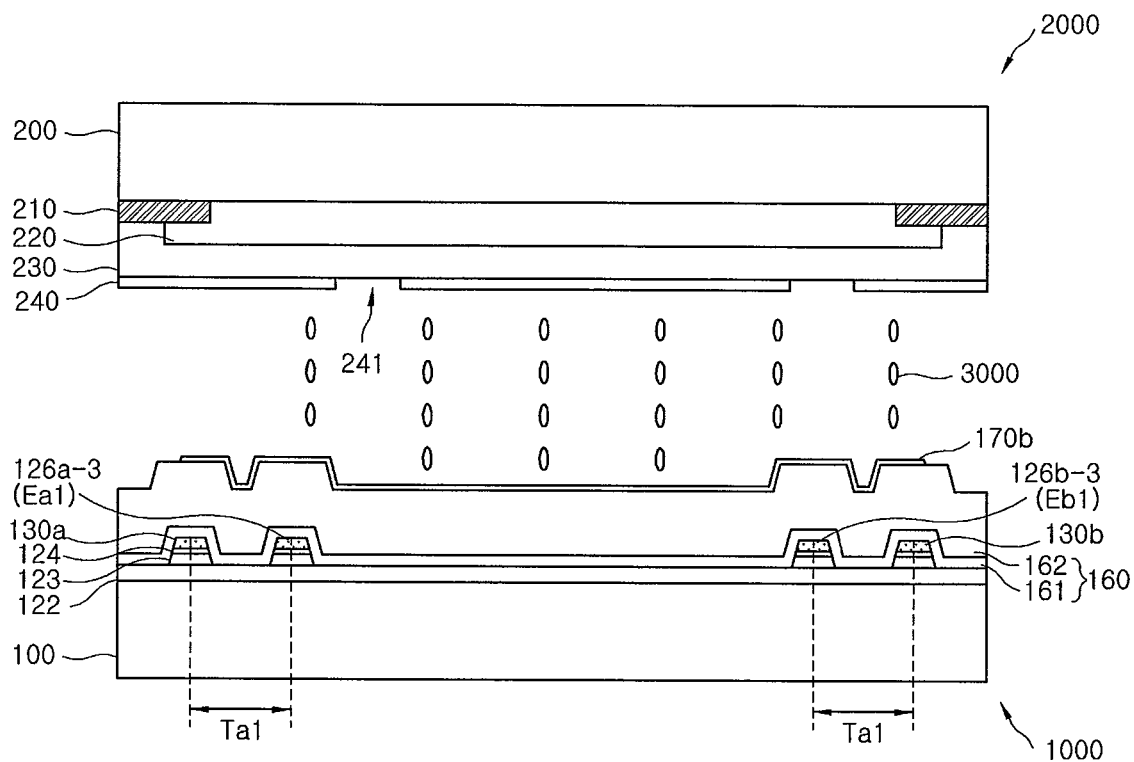
FIG. 3 is a cross-sectional view of the display device taken along a line B-B of FIG. 1.
Figure 4:
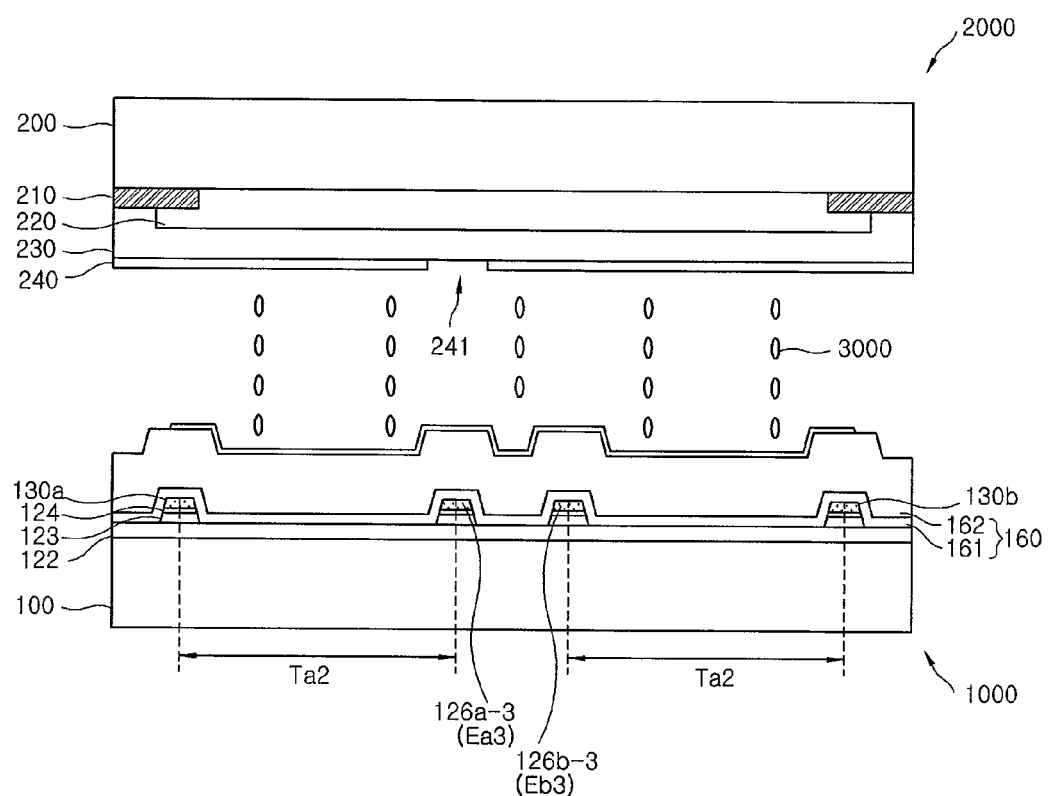
FIG. 4 is a cross-sectional view of the display device taken along a line C-C of FIG. 1.
Figure 5:
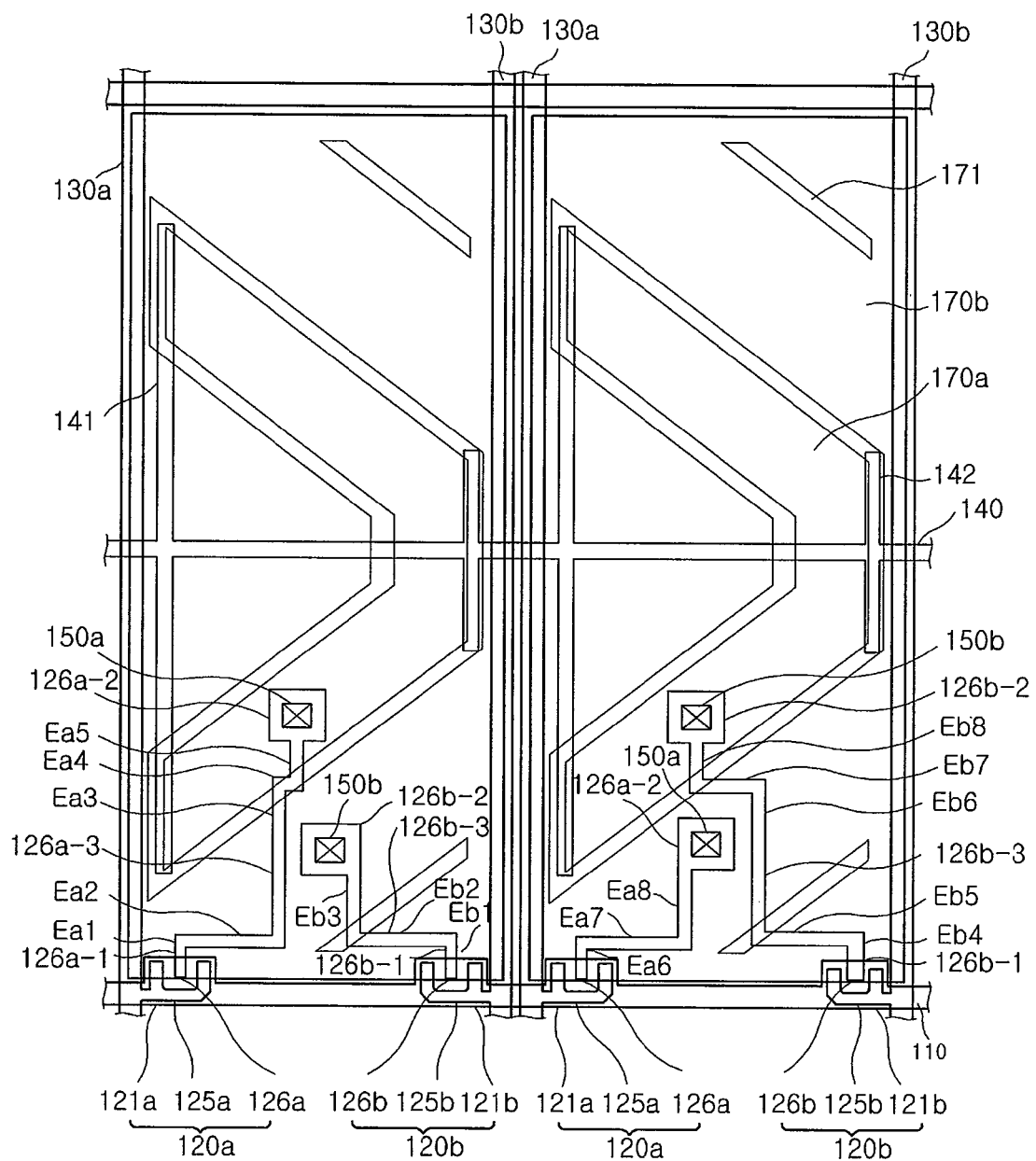
FIG. 5 is a plan view of a thin-film transistor (TFT) substrate for inversion driving according to the exemplary embodiment of the present invention.
Figure 6:
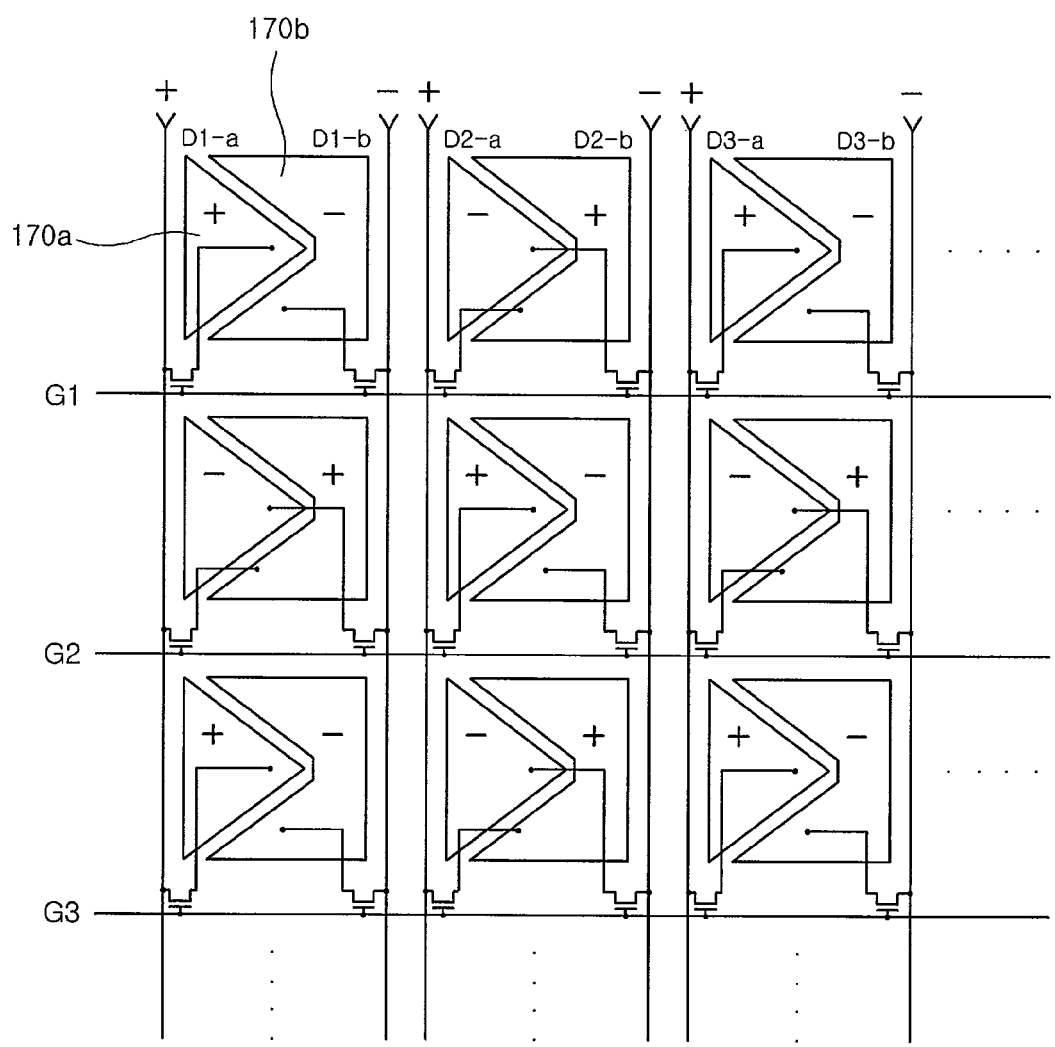
FIG. 6 is a diagram for explaining inversion driving of the display device according to the exemplary embodiment of the present invention.
Figure 7:
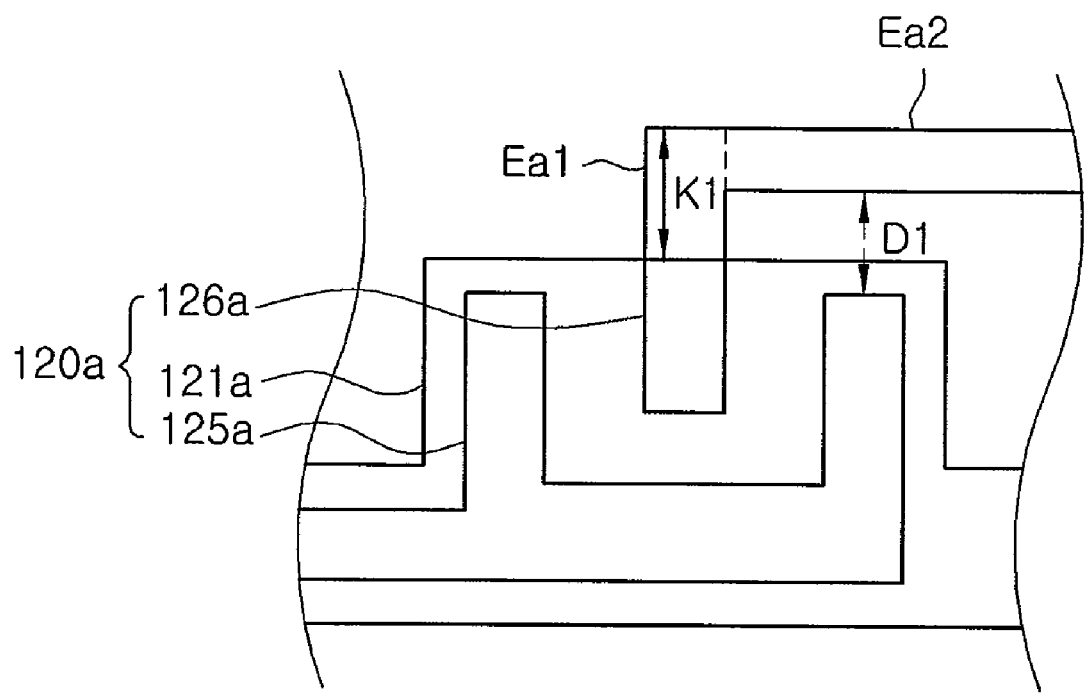
FIG. 7 is a plan view of a TFT region according to the exemplary embodiment of the present invention.
Figure 8:
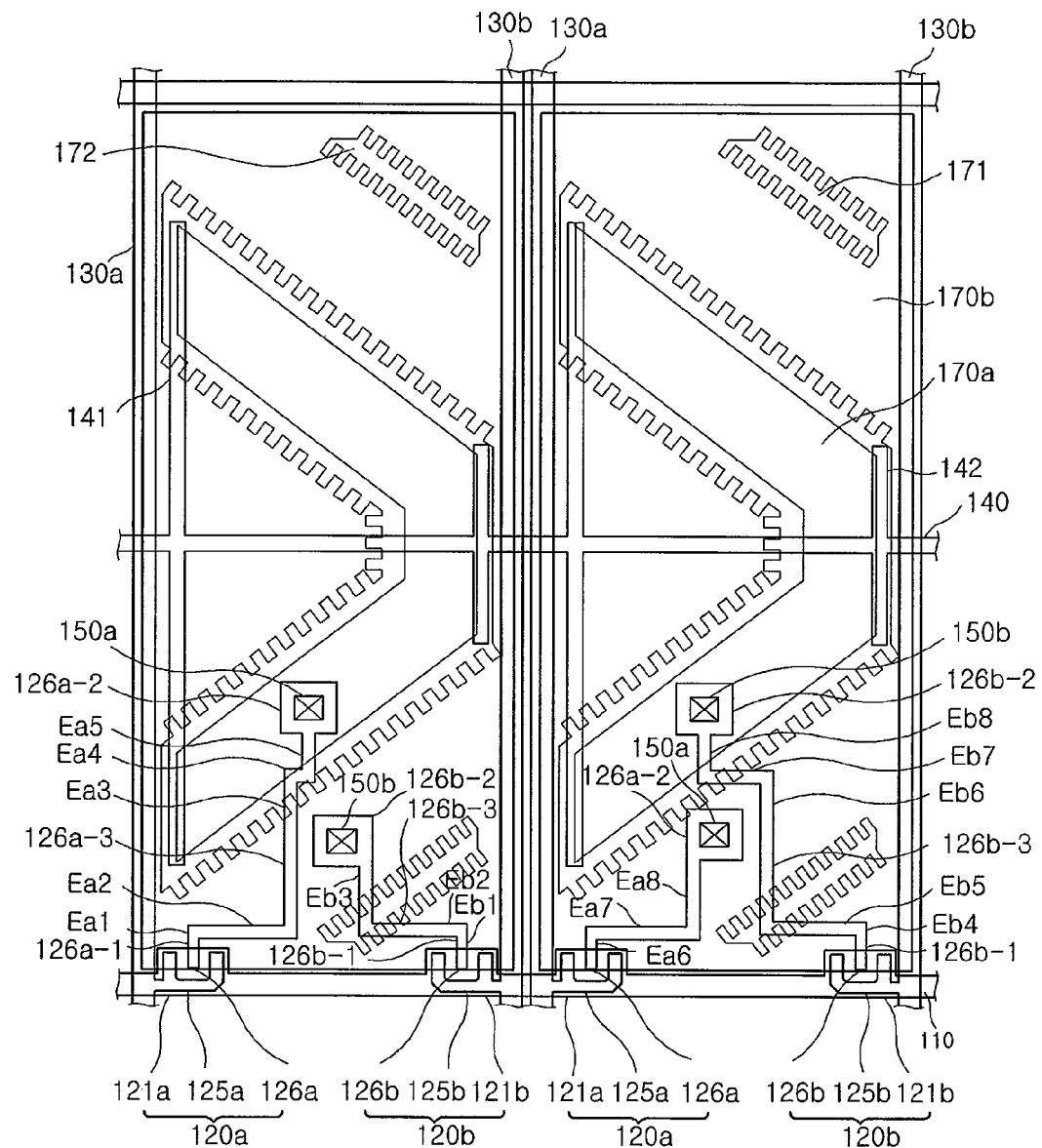
FIG. 8 is a plan view of a TFT substrate according to a modified embodiment of the exemplary embodiment of the present invention.

FIG. 1 is a plan view of a display device according to an exemplary embodiment of the present invention. FIG. 2 is a cross-sectional view of the display device taken along a line A-A of FIG. 1. FIG. 3 is a cross-sectional view of the display device taken along a line B-B of FIG. 1. FIG. 4 is a cross-sectional view of the display device taken along a line C-C of FIG. 1. FIG. 5 is a plan view of a thin-film transistor (TFT) substrate 1000 for inversion driving according to the exemplary embodiment of the present invention. FIG. 6 is a diagram for explaining inversion driving of the display device according to the exemplary embodiment of the present invention. FIG. 7 is a plan view of a TFT region according to the exemplary embodiment of the present invention. FIG. 8 is a plan view of a TFT substrate according to a modified embodiment of the exemplary embodiment of the present invention.

Referring to FIGS. 1 through 7, the display device according to the present embodiment includes the TFT substrate 1000 which is a lower substrate, a common electrode substrate 2000 which is an upper substrate that faces the TFT substrate 1000, and a liquid crystal layer 3000 interposed between the TFT substrate 1000 and the common electrode substrate 2000 and aligned in a desired direction with respect to the TFT substrate 1000 and the common electrode substrate 2000. An alignment film (not shown) is disposed on a surface of each of the TFT substrate 1000 and the common electrode substrate 2000 to align liquid crystal molecules of the liquid crystal layer 3000. The liquid crystal molecules of the liquid crystal layer 3000 may be, but are not necessarily, aligned perpendicular to each of the TFT substrate 1000 and the common electrode substrate 2000.

The TFT substrate 1000 includes a plurality of gate lines 110, first and second data lines 130a and 130b, first and second pixel electrodes 170a and 170b, and first and second TFTs 120a and 120b on a light-transmissive insulating substrate 100. The gate lines 110, deliver gate signals, extend in a first direction, and are arranged at predetermined intervals in a second direction. The first and second data lines 130a and 130b cross the gate lines 110. The first and second pixel electrodes 170a and 170b are formed in a pixel region defined by the gate lines 110 and the first and second data lines 130a and 130b. The first TFT 120a is connected to the first data line 130a and each of the gate lines 110, and the second TFT 120b is connected to the second data line 130b and each of the gate lines 110.

The pixel region may partially overlap the first and second data lines 130a and 130b as shown in FIG. 1. In addition, the pixel region may partially overlap the gate lines 110. In the present embodiment, a storage line 140 extends parallel to the gate lines 110 and penetrates the first and second pixel electrodes 170a and 170b. In addition, first and second coupling protrusions 141 and 142 are formed to maintain a constant coupling capacitance between two liquid crystal capacitors, each having the first and second pixel electrodes 170a and 170b. The first and second coupling protrusions 141 and 142 extend from the storage line 140 and partially overlap the first and second pixel electrodes 170a and 170b.

Each of the first and second TFTs 120a and 120b is connected to any one of the first and second pixel electrodes 170a and 170b. That is, referring to FIG. 5, when the first TFT 120a is connected to the first pixel electrode 170a, the second TFT 120b is connected to the second pixel electrode 170b. Conversely, when the first TFT 120a is connected to the second pixel electrode 170b, the second TFT 120b is connected to the first pixel electrode 170a.

The gate lines 110 generally extend in a horizontal direction as shown in FIG. 1, and portions of each of the gate lines 110 protrude upward to form first and second gate electrodes 121a and 121b of the first and second TFTs 120a and 120b, respectively. A gate contact pad (not shown) is formed at an end of each of the gate lines 110 to connect each of the gate lines 110 to an external circuit. However, the present invention is not limited thereto. That is, a stage, which is connected to each of the gate lines 110, may be formed at the end of each of the gate lines 110.

Each of the gate lines 110 may be composed of a single layer or two or more layers. When each of the gate lines 110 is composed of two or more layers, one of the layers may be made of a material with low resistivity, and the other layers may be made of a material having superior contact characteristics with other materials. Examples of the layers include a combination of a chrome (Cr) layer and an aluminum (Al) (or Al alloy) layer and a combination of an Al (or Al alloy) layer and a molybdenum (Mo) layer. However, the present invention is not limited thereto. The gate lines 110 may be made of various metals and conductors.

The first and second data lines 130a and 130b generally extend in a vertical direction as shown in FIG. 1 and are disposed on both sides of the first and second pixel electrodes 170a and 170b. A portion of each of the first and second data lines 120a and 120b protrudes to form a first or second source electrode 125a or 125b of the first or second TFT 120a or 120b. A data contact pad (not shown) is formed at an end of each of the first and second data lines 130a and 130b.

Each of the first and second data lines 130a and 130b may be composed of a single layer or two or more layers having different physical characteristics. When each of the first and second data lines 130a and 130b is composed of two or more layers, one of the layers may be made of a material with low resistivity to reduce the delay of a data signal or a voltage drop, and the other layers may be made of a material having superior contact characteristics with other materials.

In the drawings, the first and second data lines 130a and 130b are linear. However, each of the first and second data lines 130a and 130b may have a predetermined bent (or curved) region. If each of the first and second data lines 130a and 130b has a bent region, the first and second pixel electrodes 170a and 170b may be formed along the bent region of each of the first and second data lines 130a and 130b.

The first and second pixel electrodes 170a and 170b are disposed in a pixel region. Thus, in the present embodiment, two liquid crystal capacitors may be formed in a pixel region, that is, a unit pixel. Different grayscale signals may be transmitted to the first and second pixel electrodes 170a and 170b so that the two liquid crystal capacitors are charged with different grayscale signals.

As shown in FIGS. 1 and 5, the first pixel electrode 170a is disposed in the center of a pixel region, and the second pixel electrode 170b surrounds the first pixel electrode 170a.

The first pixel electrode 170a is shaped like a bent band, and upper and lower regions of the first pixel electrode 170a mirror each other with respect to a line that horizontally bisects the pixel region. As shown in FIG. 1, the first pixel electrode 170a includes a first band which extends from the top left of the pixel region to the right center thereof, a second band which extends from the bottom left of the pixel region to the right center thereof, and a third band which connects the first band to the second band in the right center of the pixel region. That is, the first pixel electrode 170a is roughly shaped like a 'V'. Here, the first and second bands may be at an angle of approximately 45 degrees with respect to the gate lines 110. However, the present invention is not limited thereto. That is, the first and second bands may be at various angles with respect to the gate lines 110.

The second pixel electrode 170b surrounds the first pixel electrode 170a which is roughly shaped like a 'V'. Upper and lower regions of the second pixel electrode 170b also mirror each other. The second pixel electrode 170b includes a first plate disposed in a region between the first and second bands of the first pixel electrode 170a, a second plate connected to the first plate and disposed in a region above the first band, and a third plate connected to the first and second plates and disposed in a region under the second band.

The first and second pixel electrodes 170a and 170b are separated from each other. Each of the first and second pixel electrodes 170a and 170b may include a plurality of slit patterns 171 as domain partition portions for controlling a direction in which liquid crystals are arranged. However, the present invention is not limited thereto. That is, the first and second pixel electrodes 170a and 170b may include various domain partition portions such as protrusion patterns.

Alternatively, the second pixel electrode 170b may include a plurality of micro slit patterns 172 according to a modified embodiment of the present invention shown in FIG. 8.

The first and second TFTs 120a and 120b include the first and second gate electrodes 121a and 121b, the first and second source electrodes 125a and 125b, and first and second drain electrodes 126a and 126b, respectively.

Each of the first and second source electrodes 125a and 126b may be shaped like a cup as shown in FIGS. 1 and 5. Thus, an overlapping area of each of the first and second source electrodes 125a and 125b and each of the first and second drain electrodes 126a and 126b may be expanded to increase a channel length of the first or second TFT 120a or 120b. The shape of the first and second source electrodes 125a and 125b is not limited to the cup shape. The first and second source electrodes 125a and 125b may have various shapes so as to increase the channel lengths of the first and second TFTs 120a and 120b, respectively. The first source electrode 125a is formed by protruding an end of the first data line 130a above the first gate electrode 121a. The second source electrode 125b is formed by protruding an end of the second data line 130b above the second gate electrode 121b.

Each of the first and second drain electrodes 126a and 126b is electrically connected to any one of the first and second pixel electrodes 170a and 170b. Here, first or second drain electrodes in adjacent pixel regions may be connected to different pixel electrodes. That is, as shown in FIG. 5, the first drain electrode 126a in a pixel region is connected to the first pixel electrode 170a in the pixel region, and the second drain electrode 126b is connected to the second pixel electrode 170b. On the other hand, the first drain electrode 126a in another pixel region, which is adjacent to the above pixel region, is connected to the second pixel electrode 170b in the pixel region, and the second drain electrode 126b is connected to the first pixel electrode 170b in the pixel region. Thus, a display panel according to the present embodiment can perform inversion driving.

The first and second source electrodes 125a and 125b and the first and second drain electrodes 126a and 126 are made of a material identical to that of the first and second data lines 130a and 130b and are patterned at the same time as the first and second data lines 130a and 130b. As described above, the first and second source electrodes 125a and 125b are electrically connected to the adjacent first and second data lines 130a and 130b, respectively, whereas the first and second drain electrodes 126a and 126b are electrically insulated from the adjacent first and second data lines 130a and 130b, respectively.

In addition, each of the first and second drain electrodes 126a and 126b extends to a pixel region and electrically contacts any one of the first and second pixel electrodes 170a and 170b. Accordingly, parasite capacitors (i.e., coupling capacitors) are formed between the first and second drain electrodes 126a and 126b, and the first and second data lines 130a and 130b adjacent to the first and second drain electrodes 126a and 126b, respectively.

Here, the coupling capacitors formed in a pixel region have different capacitances. That is, a first coupling capacitance of a first coupling capacitor formed between the first drain electrode 126a and the first data line 130a adjacent to the first drain electrode 126a is significantly different from a second coupling capacitance of a second coupling capacitor formed between the second drain electrode 126b and the second data line 130b adjacent to the second drain electrode 126b. Usually, the first and second coupling capacitances are different from each other by more than 50% of a maximum of the first and second coupling capacitances. For example, when the first coupling capacitance is one, the second coupling capacitance is usually two or more.

Such a difference between the first and second coupling capacitances stems from different lengths of the first drain electrode 126a, which is connected to any one of the first and second pixel electrodes 170a and 170b, and second drain electrode 126b connected to the other one of the first and second pixel electrodes 170a and 170b. That is, a capacitor is created between two adjacent conductive materials, and the capacitance of the capacitor is proportional to the overlapping area of the two conductive materials.

For the reason mentioned above, there also occurs a large difference between coupling capacitances of adjacent pixel regions. For example, in a pixel region, the first coupling capacitance between the first drain electrode 126a and the second data line 130a adjacent to the first drain electrode 126a is greater than the second coupling capacitance between the second drain electrode 126b and the second data line 130b adjacent to the second drain electrode 126b. However, in another pixel region adjacent to the above pixel region, the first coupling capacitance is smaller than the second coupling capacitance. Such a difference between the coupling capacitances of adjacent pixel regions results in a large luminances difference between adjacent pixel regions during alternative driving.

In the present embodiment, the distances between the first and second drain electrodes 126a and 126b and the first and second data lines 130a and 130b, respectively, may be adjusted to keep the first and second coupling capacitances of the first and second coupling capacitors between them within a predetermined range and minimize the first and second coupling capacitances. That is, the difference between the first and second coupling capacitances of the first and second coupling capacitors may be maintained constant within the range of 50% or less of a maximum of the first and second coupling capacitances. That is, the difference between the first and second coupling capacitances may be maintained constant within the range of 5 to 40% of a maximum of the first and second coupling capacitances. Preferably, the difference between the first and second coupling capacitances may be maintained constant within the range of 10 to 30% of a maximum of the first and second coupling capacitances.

If the difference between the first and second coupling capacitances is maintained constant within the above range, the difference between the luminances of adjacent pixel regions during inversion driving can be reduced. If the difference between the first and second coupling capacitances exceeds the above range, there occurs a significant difference between the luminances of adjacent pixel regions during inversion driving. It is best when the difference between the first and second coupling capacitances is 0, which is not, however, realistically feasible. Thus, it is desirable to keep the difference between the first and second coupling capacitances within the above range. The lengths of the first and second drain electrodes 126a and 126b, which are adjacent to the first and second data lines 130a and 130b, respectively, may be minimized so as to minimize the first and second coupling capacitances, respectively.

To this end, in the present embodiment, the distance between the first and second drain electrodes 126a and 126b and the first and second data lines 130a and 130b, respectively, are adjusted as described above. This is because the capacitance of a capacitor between two conductive materials is in inverse proportion to the distance between them.

Therefore, in the present embodiment, parts of each of the first and second drain electrodes 126a and 126b, which extend to a pixel region, are bent as shown in FIGS. 1 and 5.

The first drain electrode 126a is disposed above the first gate electrode 121a as shown in FIGS. 1 and 5. The first drain electrode 126a includes a first electrode portion 126a-1, a first contact plate 126a-2, and a first connection line 126a-3. The first electrode portion 126a-1 is disposed adjacent to the first source electrode 125a. The first contact plate 126a-2 is disposed under and connected to any one of the first and second pixel electrodes 170a and 170b. The first connection line 126a-3 connects the first electrode portion 126a-1 to the first contact plate 126a-2. The second drain electrode 126b is disposed above the second gate electrode 121b as shown in FIGS. 1 and 5. The second drain electrode 126b includes a second electrode portion 126b-1, a second contact plate 126b-2, and a second connection line 126b-3. The second electrode portion 126b-1 is disposed above the second gate electrode 121b and adjacent to the second source electrode 125b. The second contact plate 126b-2 is disposed under and connected to the other one of the first and second pixel electrodes 170a and 170b. The second connection line 126b-3 connects the second electrode portion 126b-1 to the second contact plate 126b-2.

The first coupling capacitor is formed between the first connection line 126a-3 and the first data line 130a, and the second coupling capacitor is formed between the second connection line 126b-3 and the second data line 130b. In the present embodiment, the first and second connection lines 126a-3 and 126b-3 are bent a plurality of times.

The first and second electrode portions 126a-1 and 126b-1 extend into the first and second source electrodes 125a and 125b which are shaped like cups, respectively. The first and second contact plates 126a-2 and 126b-2 may be disposed longitudinally in order to prevent leakage of light and secure a sufficient transmission ratio and may be disposed under the second band of the first pixel electrode 130a and the third plate of the second pixel electrode 130b.

In the present embodiment, the first and second connection lines 126a-3 and 126b-3 may have the same line width and may be bent vertically to prevent leakage of light.

The first connection line 126a-3 includes first through fifth extension portions Ea1 through Ea5. The first extension portion Ea1 extends from the first electrode portion 126a-1 in a direction away from the first gate electrode 121a. The second extension portion Ea2 extends from an end of the first extension portion Ea1 to be bent in a direction opposite to that of the first data line 130a. The third extension portion Ea3 extends from an end of the second extension portion Ea2 to be bent in a direction toward the first contact plate 126a-2. The fourth extension portion Ea4 extends from an end of the third extension portion Ea3 to be bent again in the direction opposite to that of the first data line 130a. The fifth extension portion Ea5 connects the fourth extension portion Ea4 to the first contact plate 126a-2.

Alternatively, the first connection line 126a-3 may include sixth through eighth extension portions Ea6 through Ea8. The sixth extension portion Ea6 extends from the first electrode portion 126a-1 in the direction away from the first gate electrode 121a. The seventh extension portion Ea7 extends from an end of the sixth extension portion Ea6 to be bent in the direction opposite to that of the first data line 130a. The eighth extension portion Ea8 connects the seventh extension portion Ea7 to the first contact plate 126a-2.

The second connection line 126b-3 includes first through third extension portions Eb1 through Eb3. The first extension portion Eb1 extends from the second electrode portion 126b-1 in a direction away from the second gate electrode 121b. The second extension portion Eb2 extends from an end of the second extension portion Eb1 to be bent in a direction opposite to that of the second data line 130b. The third extension portion Eb3 connects the second extension portion Ea2 to the second contact plate 126b-2.

Alternatively, the second connection line 126b-3 may include fourth through eighth extension portions Eb4 through Eb8. The fourth extension portion Eb4 extends from the second electrode portion 126b-1 in the direction away from the second gate electrode 121b. The fifth extension portion Eb5 extends from an end of the fourth extension portion Eb4 to be bent in the direction opposite to that of the second data line 130b. The sixth extension portion Eb6 extends from an end of the fifth extension portion Eb5 to be bent in a direction toward the second contact plate 126b-2. The seventh extension portion Eb7 extends from an end of the sixth extension portion Eb6 to be bent again in the direction opposite to that of the second data line 130b. The eighth extension portion Eb8 connects the seventh extension portion Eb7 to the second contact plate 126b-2.

The present invention is not limited to the above examples. That is, the number of extension portions may be increased or reduced. For example, in FIG. 1, the third extension portion Ea3 of the first connection line 126a-1 may be directly connected to the first contact plate 126a-2 to omit the fourth and fifth extension portions Ea4 and Ea5. The number of extension portions may be determined within a range that can maximize an aperture ratio.

This is because, for inversion driving of the display panel according to the present embodiment, when the first contact plate 126a-2 is disposed under the first pixel electrode 170a in a pixel region, the second contact plate 126-2 is disposed under the first pixel electrode 170a in another pixel region adjacent to the above pixel region, as shown in FIG. 5.

Referring to FIGS. 1 and 3, the first extension portion Ea1 of the first connection line 126a-3 and the first connection portion Eb1 of the second connection line 126b-3 are disposed closest to the first and second data lines 130a and 130b, respectively. The other extension portions of the first and second connection lines 126a-3 and 126b-3 are separated further from the first and second data lines 130a and 130b than the first extension portions Ea1 and Eb1, respectively.

As shown in FIG. 1, extension portions that affect the first and second coupling capacitances of the first and second coupling capacitors are those extending parallel to the first and second data lines 130a and 130b. That is, the first extension portion Ea1, the third extension portion Ea3 and the fifth extension portion Ea5 of the first connection line 126a-3 affect the first coupling capacitor, and the first extension portion Eb1 and the third extension portion Eb3 of the second connection line 126a-3 affect the second coupling capacitor. Alternatively, as shown in FIG. 5, the sixth and eighth extension portions Ea6 and Ea8 of the first connection line 126a-3 may affect the first coupling capacitor, and the fourth, sixth and eighth extension portions Eb4, Eb6 and Eb8 of the second connection line 126b-3 may affect the second coupling capacitor.

In the present embodiment, the first extension portion Ea1 of the first connection line 126a-3 and the first extension portion Eb1 of the second connection line 126b-3 may have the same length, and their length may be minimized. Therefore, the difference between the first and second coupling capacitances of the first and second capacitors can be reduced while the first and second coupling capacitances are reduced.

Referring to FIG. 7, a length K1 of the first extension portion Ea1 or Eb1 may be sufficient to maintain a distance D1 between the first or second source electrode 125a or 125b and the second extension portion Ea2 or Eb2, which extends from the end of the first extension portion Ea1 or Eb1, at a minimum interline gap allowed in a manufacturing process of a TFT semiconductor. Here, the minimum interline gap refers to a distance sufficient to prevent two metals (for example, metal lines) from short-circuiting when the metals are patterned in a metal patterning process. In the present embodiment, the minimum interline gap may be 4 to 10 μm.

The minimum interline gap is equal to the distance between the first or second electrode portion 126a-1 or 126b-1 of the first or second drain electrode 126a or 126b, which is disposed above and adjacent to the first or second gate electrode 121a or 121b, and the first or second source electrode 125a or 125b.

In the present embodiment, as shown in FIG. 1, the third extension portion Ea3 of the first connection line 126a-3 is separated from the second contact plate 126b-2 by the minimum interline gap. Thus, a distance Ta2 between the first data line 130a and the third extension portion Ea3 is greater than a distance Ta1 between the first data line 130a and the first extension portion Ea1 as shown in FIGS. 3 and 4. In addition, a distance Tb2 between the second data line 130b and the third extension portion Eb3 is greater than a distance Tb1 between the second data line 130b and the first extension portion Eb1 as shown in FIGS. 3 and 4.

In the present embodiment, the length K1 of the first extension portion Ea1 of the first connection line 126a-3 is minimized to reduce the capacitance between the first data line 130a and the first extension portion Ea1. In addition, the distance between the third extension portion Ea3 and the first data line 130a is maximized to reduce the capacitance between the first data line 130a and the third extension portion Ea3. Also, the length K1 of the first extension portion Eb1 of the second connection line 126b-3 is minimized to reduce the capacitance between the second data line 130b and the first extension portion Eb1.

Here, since the length K1 of the first extension portion Ea1 of the first connection line 126a-3 is equal to that of the first extension portion Eb1 of the second connection line 126b-3, the capacitance between the first data line 130a and the first extension portion Ea1 is equal to that between the second data line 130b and the first extension portion Eb1 within an acceptable error range. Since the capacitance between the first data line 130a and the third extension portion Ea3 is in inverse proportion to the distance between them, it is reduced as the distance between them increases. Thus, the capacitance between the first data line 130a and the third extension portion Ea3 has a relatively smaller value than the capacitance between the first data line 130a and the first extension portion Ea1. As shown in FIG. 1, the fifth extension portion Ea5 of the first connection line 126a-3 is located farthest from the first data line 130a. Therefore, the distance between the first data line 130a and the fifth extension portion Ea5 is negligible.

As described above, in the present embodiment, the first and second drain electrodes 126a and 126b are vertically bent a plurality of times. In this case, the first and second drain electrodes 126a and 126b are bent such that the first and second source electrodes 125a and 125b are separated from the second extension portions Ea2 and Eb2 of the first and second drain electrodes 126a and 126b, respectively, by the minimum interline gap and that the bent first and second drain electrodes 126a and 126b are separated from each other by the minimum interline gap. As a result, the first and second coupling capacitances in a pixel region can be reduced, and the difference between the first and second coupling capacitances can also be reduced. In addition, the difference between coupling capacitances of adjacent pixel regions can be reduced. Furthermore, the luminances difference between adjacent pixel regions arises when the first and second pixel electrodes 170a and 170b in a pixel region are charged with different pixel signals and when adjacent pixel regions are charged with pixel signals of opposite polarities, can be reduced.

In the present embodiment, the first and second pixel electrodes 170a and 170b are installed in one pixel region as shown in FIGS. 1 and 5 and are charged with different pixel signals. The first and second TFTs 120a and 120b provide a first and second pixel signals (a grayscale voltage), which are supplied from the first and second data lines 130a and 130b in response to a signal transmitted to the gate line 110, to the first and second pixel electrodes 170a and 170b, respectively.

In the present embodiment, the first and second pixel electrodes 170a and 170b in a pixel region may receive pixel signals via the first and second data lines 130a and 130b and the first and second TFTs 120a and 120b which are in the reverse of those for the first and second pixel electrodes 170a and 170b in another pixel region adjacent to the above pixel region. That is, as shown in FIG. 5, the first pixel electrode 170a in a pixel region receives the first pixel signal, which is transmitted to the first data line 130a from among the first and second data lines 130a and 130b on both sides of the pixel region, via the first TFT 120a in the pixel region. The second pixel electrode 170b in the pixel region receives the second pixel signal, which is transmitted to the second data line 130b from among the first and second data lines 130a and 130b on both sides of the pixel region, via the second TFT 120b in the pixel region. On the other hand, the first pixel electrode 170a in another pixel region adjacent to the above pixel region receives the second pixel signal, which is transmitted to the second data line 130b from among the first and second data lines 130a and 130b on both sides of the pixel region, via the second TFT 120b in the pixel region. The second pixel electrode 170b in the pixel region receives the first pixel signal, which is transmitted to the first data line 130a from among the first and second data lines 130a and 130b on both sides of the pixel region, via the first TFT 120a in the pixel region.

In this case, a high-grayscale signal may be used as the first pixel signal, and a low-grayscale signal may be used as the second pixel signal. Therefore, when the first and second TFTs 120a and 120b are turned on, one of the high-grayscale signal and the low-grayscale signal may be transmitted to the first pixel electrode 170a in a pixel region, and the other one of the high-grayscale signal and the low-grayscale signal may be transmitted to the second pixel electrode 170b. In addition, grayscale signals having different grayscale levels and polarities from those of the grayscale signals transmitted to the first and second pixel electrodes 170a and 170b in the above pixel region may be transmitted to the first and second pixel electrodes 170a and 170b in a pixel region adjacent to the above pixel region. That is, inversion driving can be performed.

An insulating passivation layer 160 is formed on the first and second TFTs 120a and 120b and the first and second data lines 130a and 130b. The passivation layer 160 includes a first passivation layer 161 and a second passivation layer 162. The first passivation layer 161 uses an inorganic insulating layer such as SiNx or $SiO_2$, and the second passivation layer 162 uses a low dielectric constant organic layer.

First and second pixel contact holes 150a and 150b are formed in the insulating passivation layer 160. The first pixel contact hole 150a exposes the first contact plate 126a-2 of the first drain electrode 126a, and the second pixel contact hole 150b exposes the second contact plate 126b-2 of the second drain electrode 126b.

The first and second pixel electrodes 170a and 170b described above are formed on the passivation layer 160. The pixel electrode 170a is connected to any one of the first and second drain electrodes 126a and 126b by any one of the first and second pixel contact holes 150a and 150b, and the second pixel electrode 170b is connected to the other one of the first and second drain electrodes 126a and 126b by the other one of the first and second pixel contact holes 150a and 150b.

In the present embodiment, the storage line 140 extends in a direction identical to the direction, in which each of the gate lines 110 extends, and penetrates each pixel region. In addition, the first and second coupling protrusions 141 and 142 extend from the storage line 140 and partially overlap the first and second pixel electrodes 170a and 170b. The first and second coupling protrusions 141 and 142 are formed to maintain constant right and left coupling capacitances in each pixel region. That is, when coupled to the corresponding data lines on the right and left sides of each pixel region, the first and second pixel electrodes 170a and 170b may change, thereby causing crosstalk. To address this problem, in the present embodiment, the first and second coupling protrusions 141 and 142 are formed to maintain the right and left coupling capacitances constant. In this case, it may be more effective if the length of the first coupling protrusion 141 is longer than that of the second coupling protrusion 142 as shown in FIGS. 1 and 5. The first coupling protrusion 141 is disposed adjacent to the first data line 130a, and the second coupling protrusion 142 is disposed adjacent to the second data line 130b.

The storage line 140 and the first and second coupling protrusions 141 and 142 are made of a material identical to that of the gate lines 110 and are patterned at the same time as the gate lines 110. In this case, it is effective to apply a common voltage to the storage line 140.

The common electrode substrate 2000 includes a black matrix 210, red, green and blue color filters 220, and an overcoat layer 230. The black matrix 210 is formed on a bottom surface of an insulating substrate 200 made of a transparent insulating material such as glass. The black matrix 210 prevents leakage of light and optical interference between adjacent pixel regions. The overcoat layer 230, made of an organic material, is formed on the color filters 220. A common electrode 240, made of a transparent conductive material such as indium tin oxide (ITO) or indium zinc oxide (IZO), is formed on the overcoat layer 230. A plurality of slit patterns 241 are formed in the common electrode 240. In the present embodiment, the slit patterns 241 are disposed at locations that bisect the first and second pixel electrodes 170a and 170b as shown in FIG. 1. Protrusion patterns may also be used instead of the slit patterns 241.

The slit patterns 171 of the first and second pixel electrodes 170a and 170b and the slit patterns 241 of the common electrode 240 function as domain partition portions that partition liquid crystal molecules and align them accordingly. The domain partition portions may be installed in any one or more of the first and second pixel electrodes 170a and 170b and the common electrode 240. Each of first and second subpixel capacitors is formed between each of the first and second pixel electrodes 170a and 170b and the common electrode 240. Therefore, a unit pixel having two subpixel capacitors can be formed in each pixel region. In the display device according to the present embodiment, a plurality of unit pixels are arranged in a matrix.

The TFT substrate 1000 and the common electrode substrate 2000 described above are coupled to each other, and the liquid crystal layer 3000 is interposed between the TFT substrate 1000 and the common electrode substrate 2000. Accordingly, a base panel of the display device having first and second subpixels in each unit pixel according to the present embodiment is completed. The display device may include liquid crystals having negative-type dielectric constant anisotropy between the TFT substrate 1000 and the common electrode substrate 2000, and the liquid crystals may be vertically aligned. However, the present invention is not limited thereto. Although not shown in the drawings, a polarizer, a backlight, a compensator, and other components may be installed on both sides of the base panel of the display device.

Hereinafter, the operation of the display device, which includes a plurality of unit pixels, each having first and second subpixel capacitors in a pixel region, will be described in detail.

When first and second grayscale voltages are applied respectively to the first and second pixel electrodes 170*a* and 170*b* in a unit pixel, there arises a potential difference between the common electrode 240, to which a common voltage Vcom is applied, and each of the first and second pixel electrodes 170*a* and 170*b*. The potential difference causes liquid crystals interposed between the TFT substrate 1000 and the common electrode substrate 2000 to rotate by dielectric anisotropy. In addition, the amount of light, which is incident to the liquid crystal layer 3000 from a light source (not shown) via the first and second pixel electrodes 170*a* and 170*b*, is controlled by the potential difference, and the light is transmitted toward the common electrode substrate 2000. The light transmitted to the common electrode substrate 2000 passes through the color filters 220 formed on the common electrode substrate 2000. Consequently, an intended color is presented.

The alternative driving of the display device will now be described, centering on the transmission of grayscale signals to the first and second pixel electrodes 170*a* and 170*b* of the TFT substrate 1000.

A gate turn-on voltage from an external source is sequentially applied to the gate lines 110, and a plurality of grayscale voltages are applied to the first and second data lines 130*a* and 130*b*, respectively. Then, the first and second TFTs 120*a* and 120*b* connected to each of the gate lines 110, to which the gate turn-on voltage is applied, are turned on. Accordingly, a first grayscale signal of the first data line 130*a* connected to the first TFT 120*a* is transmitted to the first or second pixel electrode 170*a* or 170*b* which is connected to the first TFT 120*a*. In addition, a second grayscale signal of the second data line 130*b* connected to the second TFT 120*b* is transmitted to the first or second pixel electrode 170*a* or 170*b* connected to the second TFT 120*b*, which will now be described in more detail.

FIG. 5 shows two adjacent pixel region patterns. For simplicity, a pixel region pattern on the left of FIG. 5 will be referred to as a first pixel region pattern, and a pixel region pattern on the right of FIG. 5 will be referred to as a second pixel region pattern.

When the gate turn-on voltage is applied to the gate lines 110, the first and second TFTs 120*a* and 120*b* are turned on. Thus, the first and second pixel electrodes 170*a* and 170*b* of the first pixel region pattern are electrically connected to the first and second data lines 130*a* and 130*b*, respectively. In addition, the first and second pixel electrodes 170*a* and 170*b* of the second pixel region pattern are electrically connected to the second and first data lines 130*b* and 130*a*, respectively. In this way, the first and second pixel electrodes 170*a* and 170*b* of the adjacent first and second pixel region patterns are electrically connected to the first and second data lines 130*a* and 130*b* in reverse orders.

Here, the display device performs line inversion driving in which signals having opposite polarities are transmitted to adjacent data lines. When a frame frequency of the display device is 60 Hz or higher (for example, 120 Hz), the load of each data line is increased. Thus, dot inversion driving is realistically impossible. However, in the present embodiment, the connection between each of the first and second pixel electrodes 170*a* and 170*b* and each of the first and second data lines 130*a* and 130*b* is reversed on a pixel region-by-pixel region basis as described above, thereby obtaining the effect of dot inversion driving. As a result, stains, i.e., vertical lines, can be reduced.

Referring to FIG. 6, when the gate turn-on voltage is applied to a first gate line G1, the first and second TFTs 120*a* and 120*b* connected to the first gate line G1 are also turned on. Accordingly, a positive first grayscale signal of a first data line D1-*a* in a first pixel region is transmitted to the first pixel electrode 170*a* in the first pixel region, and a negative second grayscale signal of a second data line D1-*b* in the first pixel region is transmitted to the second pixel electrode 170*b* in the first pixel region. In addition, a positive first grayscale signal of a first data line D2-*a* in a second pixel region is transmitted to the second pixel electrode 170*b* in the second pixel region, and a negative grayscale signal of a second data line D2-*b* in the second pixel region is transmitted to the first pixel electrode 170*a* in the second pixel region. A positive first grayscale signal of a first data line D3-*a* in a third pixel region is transmitted to the first pixel electrode 170*a* in the third pixel region, and a negative second grayscale signal of a second data line D3-*b* in the third pixel region is transmitted to the second pixel electrode 170*b* in the third pixel region.

Accordingly, the first pixel electrode 170*a* in the first pixel region is charged with a positive voltage, and the first pixel electrode 170*a* in the second pixel region adjacent to the first pixel region is charged with a negative voltage. In addition, the second pixel electrode 170*b* in the first pixel region is charged with a negative voltage, and the second pixel electrode 170*b* in the second pixel region adjacent to the first pixel region is charged with a positive voltage. Since the first or second pixel electrodes 170*a* or 170*b* in adjacent pixel regions are charged with different grayscale voltages having different levels, dot inversion driving can be performed. The dot inversion driving can prevent the creation of stains, i.e., vertical lines.

In the present embodiment, the first and second TFTs 120*a* and 120*b* are simultaneously turned on or off. Thus, the first and second grayscale signals can be simultaneously provided to the first and second pixel electrodes 170*a* and 170*b* during a period of 1H. Consequently, even if the frame frequency is increased, a sufficient time for charging the first and second pixel electrodes 170*a* and 170*b* with the first and second grayscale signals can be secured.

As described above, in the present embodiment, the first and second drain electrodes 126*a* and 126*b* are bent such that the lengths of the first and second drain electrodes 126*a* and 126*b*, which are adjacent to the first and second data lines 130*a* and 130*b*, respectively, can be minimized.

Accordingly, the capacitance of a coupling capacitor between each of the first and second data lines 130*a* and 130*b* and each of the first and second drain electrode 126*a* and 126*b* can be minimized, and the difference between the capacitances of the coupling capacitors of adjacent pixel regions can be reduced, thereby minimizing the difference between the luminances of adjacent pixel regions which may arise during inversion driving.

Figure 9A:
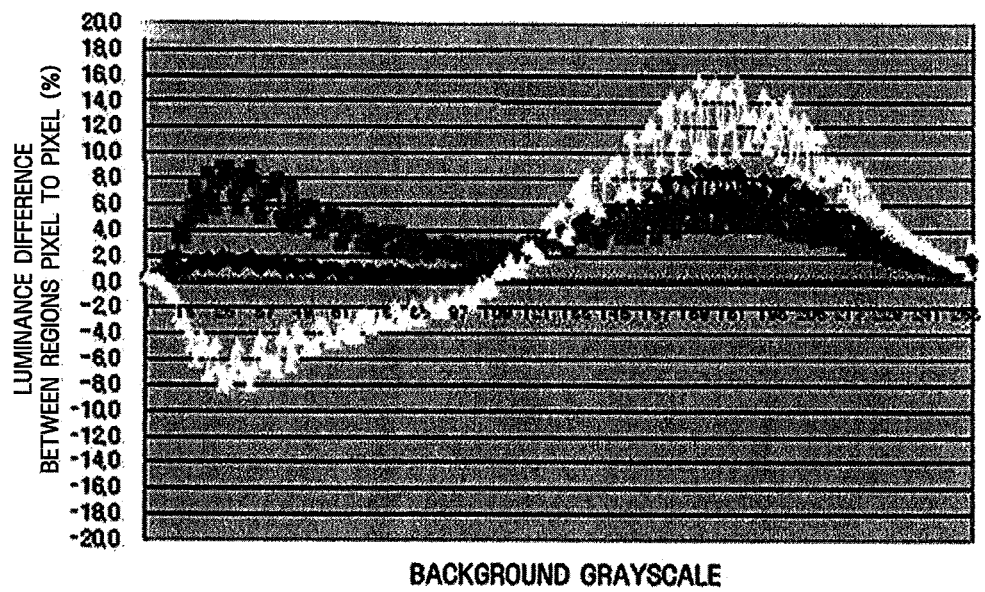
FIG. 9A is a graph illustrating an average luminance deviation of a display device according to a comparative example.

FIG. 9A is a graph illustrating an average luminance deviation of a display device according to a comparative example.

Figure 9B:
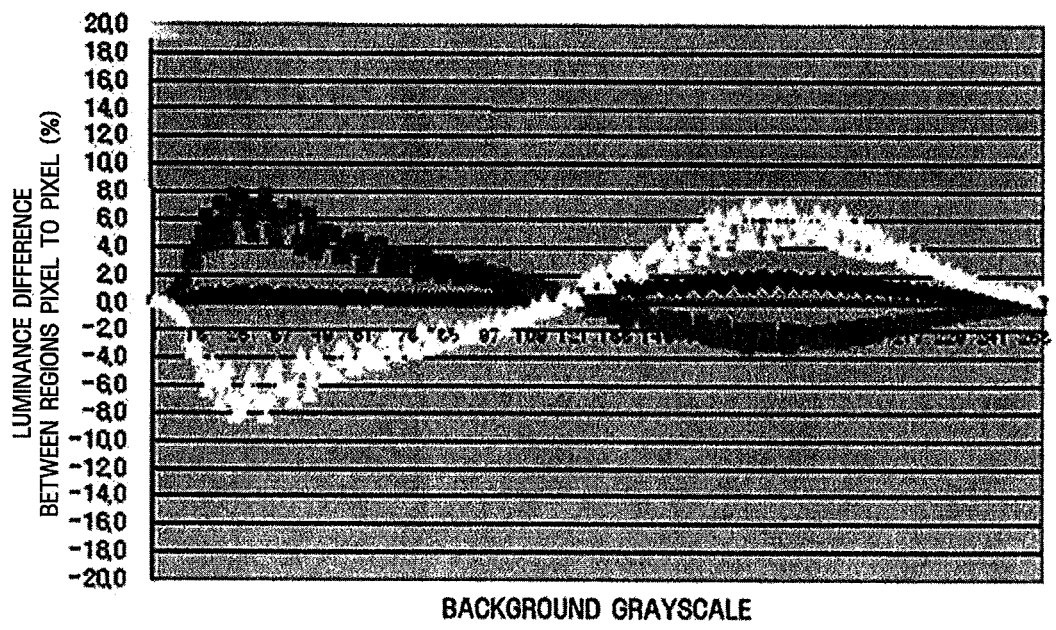
FIG. 9B is a graph illustrating an average luminance deviation of the display device according to the exemplary embodiment of the present invention.

FIG. 9B is a graph illustrating an average luminance deviation of the display device according to the exemplary embodiment of the present invention.

Specifically, the graph of FIG. 9A illustrates the average luminance deviation of the display device in which first and second connection lines 126a-3 and 126b-3 of first and second drain electrodes 126a and 126b, respectively, are not bent or are bent only once. That is, the first and second connection lines 126a-3 and 126b-3 may extend from first and second electrode portions 126a-1 and 126b-2 of the first and second drain electrodes 126a and 126b and may be connected directly to first and second contact plates 126a-2 and 126b-2, respectively. Alternatively, the first and second connection lines 126a-3 and 126b-3 may extend from the first and second electrode portions 126a-1 and 126b-2 of the first and second drain electrodes 126a and 126b to regions adjacent to the first and second contact plates 126a-2 and 126b-2, respectively, may be bent at the regions, and may be connected to the first and second contact plates 126a-2 and 126b-2, respectively.

On the other hand, the graph of FIG. 9B illustrates the average luminance deviation of the display device in which the first and second connection lines 126a-3 and 126b-3 of the first and second drain electrodes 126a and 126b are bent above the first and second gate electrodes 121a and 121b of the first and second TFTs 120a and 120b, respectively, are bent again one or more times, and then connected to the first and second contact plates 126a-2 and 126b-2, respectively, as shown in FIG. 5.

Referring to the graph of FIG. 9A, the display device according to the comparative example has a large coupling capacitor between each of the first and second data lines 130a and 130b and each of the first and second connection lines 126a-3 and 126b-3. In addition, the coupling capacitors of unit pixels are not uniform. Thus, the display device according to the comparative example shows a large average luminance deviation.

On the other hand, referring to the graph of FIG. 9B, the display device according to the exemplary embodiment of the present invention has a small coupling capacitor between each of the first and second data lines 130a and 130b and each of the first and second connection lines 126a-3 and 126b-3. In addition, the coupling capacitors of unit pixels are uniform. Thus, the display device according to the exemplary embodiment of the present invention shows a reduced average luminance deviation.

As described above, according to the present invention, a drain electrode of a TFT connected to a pixel electrode in a unit pixel is vertically bent a plurality of times to increase the distance between a data line, which is disposed adjacent to the unit pixel, and the drain electrode. Accordingly, a parasite capacitance (i.e., a coupling capacitance) between the data line and the drain electrode can be reduced, and each unit pixel can have a uniform parasite capacitance within a predetermined range.

In addition, the present invention can reduce parasite capacitances and the difference between the parasite capacitances, thereby reducing the luminance deviation of the display device which performs inversion driving.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A thin-film transistor (TFT) substrate comprising:
   a plurality of gate lines and a plurality of first and second data lines that cross the gate lines;
   a plurality of first and second pixel electrodes disposed in a plurality of unit pixel regions defined by the gate lines and the first and second data lines, respectively;
   a first TFT disposed in a unit pixel region and comprises a first gate terminal connected to a gate line, a first source electrode connected to a first data line, and a first drain electrode connected to any one of first and second pixel electrodes; and
   a second TFT disposed in the unit pixel region and comprises a second gate terminal connected to the gate line, a second source electrode connected to a second data line, and a second drain electrode connected to the other one of the first and second pixel electrodes,
   wherein the first and second drain electrodes are disposed to maintain the difference between a first coupling capacitance between the first drain electrode and the first data line and a second coupling capacitance between the second drain electrode and the second data line within a range of 50% or less of a maximum of the first and second coupling capacitances.

2. The substrate of claim 1, wherein the difference between the first coupling capacitance and the second coupling capacitance is 5 to 40% of a maximum of the first and second coupling capacitances.

3. The substrate of claim 1, wherein the first and second drain electrodes are bent a plurality of times.

4. The substrate of claim 3, wherein the first and second drain electrodes are vertically bent.

5. The substrate of claim 4, wherein end regions of the first and second drain electrodes are separated from the first and second source electrodes, respectively, and a distance between the end region of each of the first and second drain electrodes and the first or second source electrode is equal to a distance between a region extending from an end of the end region of each of the first and second drain electrodes, at which the first or second drain electrode is bent, and the first or second source electrode.

6. The substrate of claim 5, wherein respective regions of the bent first and second drain electrodes are separated from each other by the above distance in the center of the unit pixel region.

7. The substrate of claim 5, wherein the distance is an interline gap sufficient to prevent a short circuit between each of the first and second source electrodes and the first or second drain electrode, and the interline gap is 4 to 10 μm.

8. The substrate of claim 1, wherein the first drain electrode comprises a first electrode portion disposed above the first gate electrode and adjacent to the first source electrode, a first contact plate connected to one of the first and second pixel electrodes, and a first connection line that connects the first electrode portion to the first contact plate, and
   the second drain electrode comprises a second electrode portion disposed above the second gate electrode and adjacent to the second source electrode, a second contact plate connected to the other one of the first and second pixel electrodes, and a second connection line that connects the second electrode portion to the second contact plate.

9. The substrate of claim 8, wherein the first contact plate of the first drain electrode in a first unit pixel region is connected to the first pixel electrode, and the second contact plate of the second drain electrode in the first unit pixel region is connected to the second pixel electrode, and wherein the first contact plate of the first drain electrode in a second unit pixel region adjacent to the first unit pixel region is connected to the second pixel electrode, and the second contact plate of the second drain electrode in the second unit pixel region is connected to the first pixel electrode.

10. The substrate of claim 9, wherein, if the first contact plate of the first drain is connected to the first pixel electrode and the second contact plate of the second drain electrode is connected to the second pixel electrode, the first connection line comprises a 1-1 extension portion extending from the first electrode portion in a direction away from the first gate electrode, a 1-2 extension portion extending from an end of the 1-1 extension portion to be bent in a direction opposite to that of the first data line, a 1-3 extension portion extending from an end of the 1-2 extension portion to be bent in a direction toward the first contact plate, a 1-4 extension portion extending from an end of the 1-3 extension portion to be bent in the direction opposite to that of the first data line, and a 1-5 extension portion connecting the 1-4 extension portion to the first contact plate, and the second connection line comprises a 2-1 extension portion extending from the second electrode portion in a direction away from the second gate electrode, a 2-2 extension portion extending from an end of the 2-1 extension portion to be bent in a direction opposite to that of the second data line, and a 2-3 extension portion connecting the 2-2 extension portion to the second contact plate.

11. The substrate of claim 10, wherein a distance between the 1-3 extension portion and the first data line and a distance between the 1-5 extension portion and the first data line are greater than a distance between the 1-1 extension portion and the first data line, and the distance between the 1-1 extension portion and the first data line is equal to a distance between the 2-1 extension portion and the second data line within an acceptable error range.

12. The substrate of claim 9, where if the first contact plate of the first drain is connected to the second pixel electrode and the second contact plate of the second drain electrode is connected to the first pixel electrode, the first connection line comprises a 1-6 extension portion extending from the first electrode portion in the direction away from the first gate electrode, a 1-7 extension portion extending from an end of the 1-6 extension portion to be bent in the direction opposite to that of the first data line, and a 1-8 extension portion connecting the 1-7 extension portion to the first contact plate, and the second connection line comprises a 2-4 extension portion extending from the second electrode portion in the direction away from the second gate electrode, a 2-5 extension portion extending from an end of the 2-4 extension portion to be bent in the direction opposite to that of the second data line, a 2-6 extension portion extending from an end of the 2-5 extension portion to be bent in a direction toward the second contact plate, a 2-7 extension portion extending from an end of the 2-6 extension portion to be bent in the direction opposite to that of the second data line, and a 2-8 extension portion connecting the 2-7 extension portion to the second contact plate.

13. The substrate of claim 12, wherein a distance between the 2-6 extension portion and the second data line and a distance between the 2-8 extension portion and the second data line are greater than a distance between the 2-4 extension portion and the second data line, and the distance between the 2-4 extension portion and the second data line is equal to a distance between the 1-6 extension portion and the first data line within an acceptable error range.

14. The substrate of claim 1, wherein the first and second data lines, the first and second source electrodes, and the first and second drain electrodes are made of an identical material and simultaneously patterned.

15. The substrate of claim 1, further comprising:
a plurality of storage lines which pass through the unit pixel regions, respectively, and extend in a direction identical to that of the gate lines; and
first and second coupling protrusions which extend from each of the storage lines and partially overlap the first and second pixel electrodes,
wherein the first coupling protrusion is disposed adjacent to the first data line, the second coupling protrusion is disposed adjacent to the second data line, and the first coupling protrusion is longer than the second coupling protrusion.

16. A display device comprising:
a plurality of unit pixels each arranged in a matrix and comprising a first pixel capacitor having a first pixel electrode and a common electrode and a second pixel capacitor having a second pixel electrode and the common electrode;
a plurality of gate lines that extend in a row direction of the unit pixels;
a plurality of first and second data lines that extend in a column direction of the unit pixels and are arranged on both sides of each column of unit pixels, respectively;
a first TFT disposed in each of the unit pixels and comprises a first source electrode connected to the first data line and a first drain electrode connected to any one of the first and second pixel capacitors; and
a second TFT disposed in each of the unit pixel regions and comprises a second source electrode connected to the second data line and a second drain electrode connected to the other one of the first and second pixel capacitors,
wherein the first and second drain electrodes are bent a plurality of times to maintain the difference between a first coupling capacitance between the first drain electrode and the first data line and a second coupling capacitance between the second drain electrode and the second data line within a range of 50% or less of a maximum of the first and second coupling capacitances.

17. The device of claim 16, wherein the first and second drain electrodes are vertically bent.

18. The device of claim 16, wherein end regions of the first and second drain electrodes are separated from the first and second source electrodes, respectively, and a distance between the end region of each of the first and second drain electrodes and the first or second source electrode is equal to a distance between a region extending from an end of the end region of each of the first and second drain electrodes, at which the first or second drain electrode is bent, and the first or second source electrode.

19. The device of claim 18, wherein the distance is an interline gap which is sufficient to prevent a short circuit between each of the first and second source electrodes and the first or second drain electrode, and the interline gap is 4 to 10 µm.

20. The device of claim 16, wherein the first drain electrode comprises a first electrode portion disposed above a first gate electrode and adjacent to the first source electrode, a first contact plate connected to one of the first and second pixel electrodes, and a first connection line that connects the first electrode portion to the first contact plate, and the second drain electrode comprises a second electrode portion disposed above the second gate electrode and adjacent to the second source electrode, a second contact plate connected to the other one of the first and second pixel electrodes, and a second connection line that connects the second electrode portion to the second contact plate.

21. The device of claim 20, wherein the first contact plate of the first drain electrode in a first unit pixel is connected to the first pixel capacitor, and the second contact plate of the second drain electrode in the first unit pixel region is connected to the second pixel capacitor, and wherein the first contact plate of the first drain electrode in a second unit pixel adjacent to the first unit pixel is connected to the second pixel capacitor, and the second contact plate of the second drain electrode is connected to the first pixel capacitor.

* * * * *